(12) United States Patent
Baselmans et al.

(10) Patent No.: US 7,180,577 B2
(45) Date of Patent: Feb. 20, 2007

(54) LITHOGRAPHIC APPARATUS AND DEVICE MANUFACTURING METHOD UTILIZING A MICROLENS ARRAY AT AN IMAGE PLANE

(75) Inventors: Johannes Jacobus Matheus Baselmans, Oirschot (NL); Huibert Visser, Zevenhuizen (NL)

(73) Assignee: ASML Netherlands B.V., Veldhoven (NL)

( * ) Notice: Subject to any disclaimer, the term of this patent is extended or adjusted under 35 U.S.C. 154(b) by 105 days.

(21) Appl. No.: 11/013,938

(22) Filed: Dec. 17, 2004

(65) Prior Publication Data

US 2006/0132751 A1 Jun. 22, 2006

(51) Int. Cl.
*G03B 27/54* (2006.01)
(52) U.S. Cl. .......................... 355/67; 355/71
(58) Field of Classification Search .......... None
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 7,079,225 B2 * | 7/2006 | Baselmans et al. | 355/67 |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| WO | WO 98/33096 | 7/1998 |
|---|---|---|
| WO | WO 98/38597 | 9/1998 |

* cited by examiner

*Primary Examiner*—D. Rutledge
(74) *Attorney, Agent, or Firm*—Sterne, Kessler, Goldstein & Fox P.L.L.C.

(57) ABSTRACT

A lithographic apparatus includes a radiation system, a patterning device, and a projection system. The patterning device patterns a beam of radiation from the radiation system. The projection system projects the patterned beam onto a target portion of a substrate. The projection system comprising a pupil positioned at a pupil plane of the projection system and an array of lenses positioned at an image plane of the projection system. The patterning device is conjugate to the array of lenses and the pupil is conjugate to the substrate.

18 Claims, 11 Drawing Sheets

LITHOGRAPHIC APPARATUS AND DEVICE MANUFACTURING METHOD UTILIZING A MICROLENS ARRAY AT AN IMAGE PLANE

BACKGROUND

1. Field of the Invention

The present invention relates to a lithographic apparatus and a device manufacturing method.

2. Related Art

A lithographic apparatus is a machine that applies a desired pattern onto a target portion of a substrate (e.g., a workpiece, an object, a display, etc.). The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern. This is referred to as maskless lithography.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

Another way of imaging includes pixel grid imaging, in which a pattern is realized by successive exposure of spots.

Therefore, what is needed is a system and method that is used to improve maskless lithography techniques.

SUMMARY

According to an embodiment of the present invention, there is provided a lithographic apparatus comprising a radiation system, a patterning device, and a projection system. The radiation system provides a beam of radiation. The patterning device patterns the beam. The projection system projects the patterned beam onto a target portion of a substrate. The projection system comprises a pupil stop and an array of lenses. The pupil stop is positioned at a pupil plane of the projection system. The array of lenses is positioned at an image plane of the projection system. The patterning device is conjugate to the array of lenses and the pupil is conjugate to the targets portions of the substrate.

According to another embodiment of the present invention, there is provided a device manufacturing method comprising the following steps. Patterning a beam of radiation using a patterning device. Directing the patterned beam onto a microlens array in a projection system. The microlens array being positioned conjugate to the patterning device. Forming a plurality of segments of the pattern beam, each segment being formed using a respective lens in the microlens array. Projecting a Fourier transform of each of the segments of the patterned beam onto a target portion of a substrate.

According to a further embodiment of the present invention, there is provided a method comprising the following steps. Positioning a patterning device at an object plane of a projection system. Positioning a microlens array at an image plane of the projection system, which is conjugate to the patterning device at the object plane. Positioning a workpiece conjugate to a pupil plane of the projection system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light.

Using an appropriate spatial filter, the filter can filter out the diffracted light, leaving the undiffracted light to reach the substrate. In this manner, the beam becomes patterned according to the addressing pattern of the matrix-addressable surface. It will be appreciated that, as an alternative, the undiffracted light can be filtered out of the reflected beam, leaving only the diffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors.

The required matrix addressing can be performed using suitable electronic means.

In both of the situations described here above, the array of individually controllable elements can comprise one or more programmable mirror arrays. A programmable LCD array can also be used. It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 355, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Exemplary Lithographic Projection Tools

Figure 1:
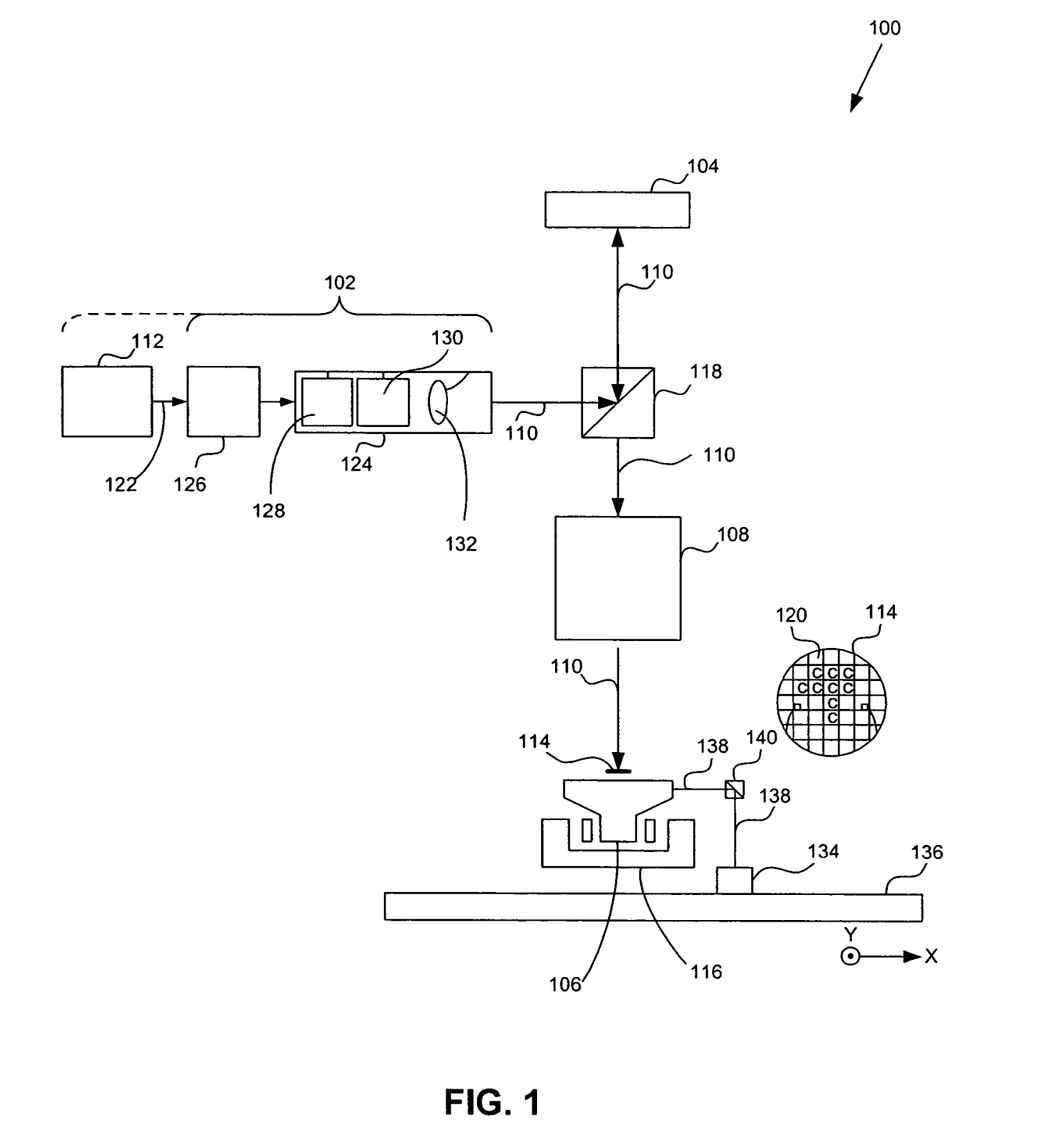
FIGS. 1 and 2 depict exemplary lithographic apparatus, according to various embodiments of the present invention.
Figure 2:
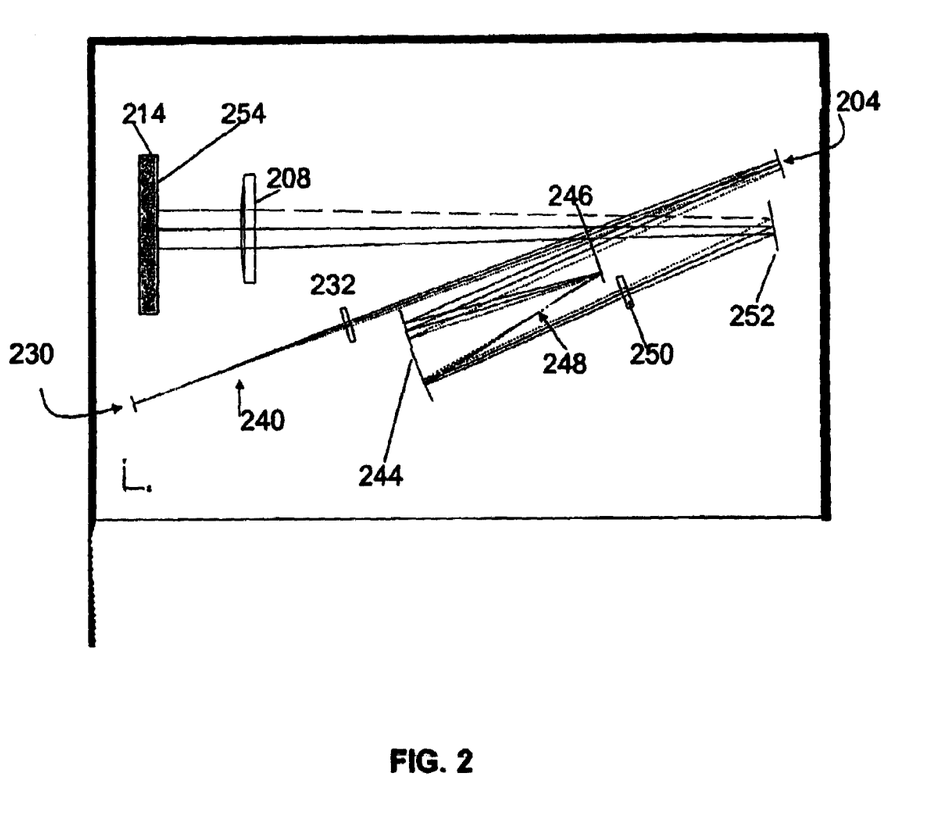

FIGS. 1 and 2 depict exemplary lithography systems 100 and 200, according to various embodiments of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114, as is discussed in more detail below.

Source 112 (e.g., a frequency tripled Nd:YAG laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

It should be noted, with regard to FIG. 1, that source 112 can be within the housing of lithographic projection apparatus 100. In alternative embodiments, source 112 can also be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

FIG. 2 shows another exemplary lithography system 200, according to one embodiment of the present invention. A beam (not shown) impinges on a spot generator 230 to form multiple beams 240-$n$ (where n is an integer greater than or equal to 1) which are directed onto a patterning device 204 using an optical element 232. A patterned beam 242 is reflected between optical devices 244 and 246, which path includes a pupil stop 248, onto a fold mirror 252, through projection system 208 and an microlens array 254 (MLA), and onto a substrate 214.

The depicted apparatus 100/200 can be used in five preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially a same shape. One substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Exemplary Imaging Systems

Figure 3:
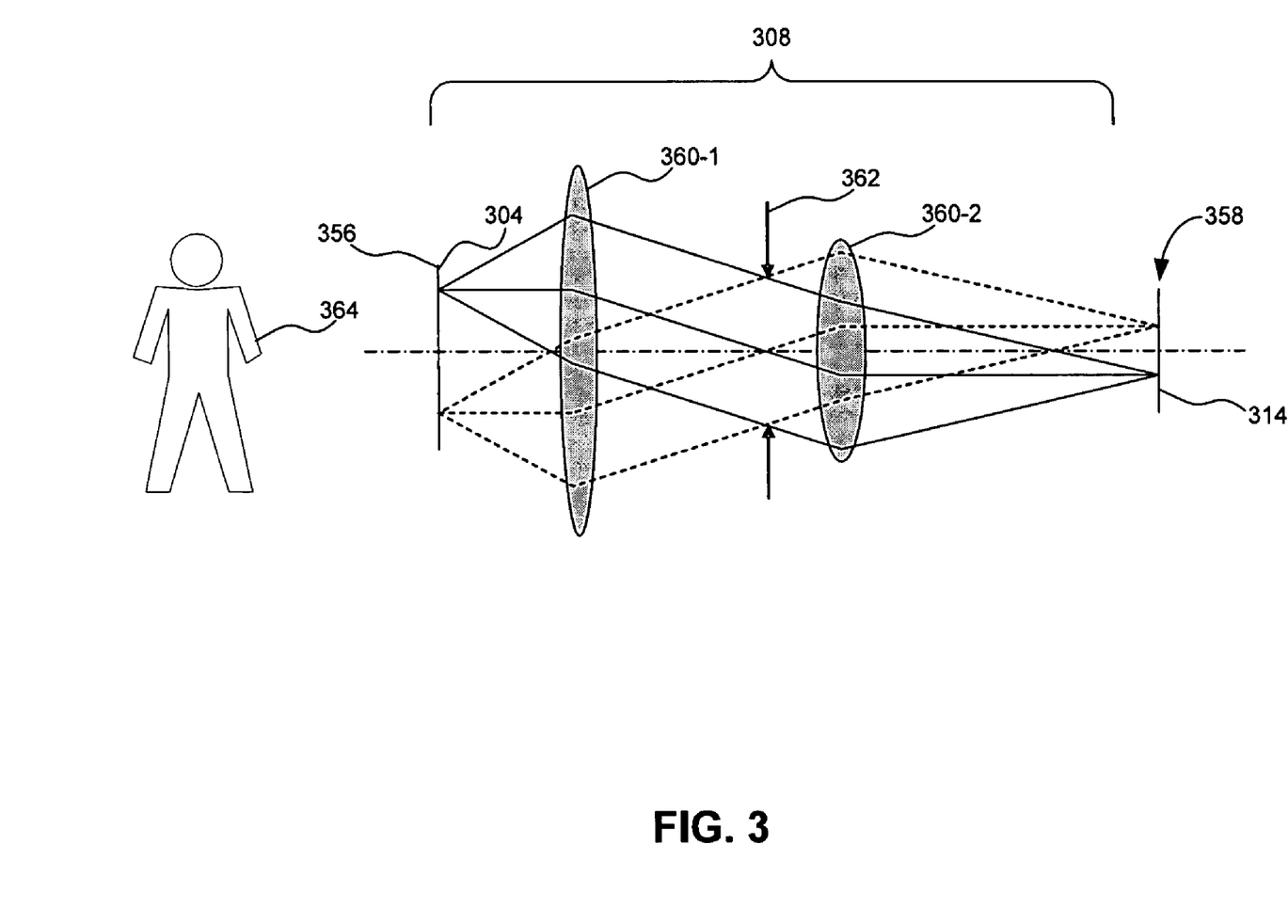
FIGS. 3 and 4 depict imaging system that can be used in the lithographic apparatus of FIGS. 1 and 2, according to various embodiments of the present invention.
Figure 4:
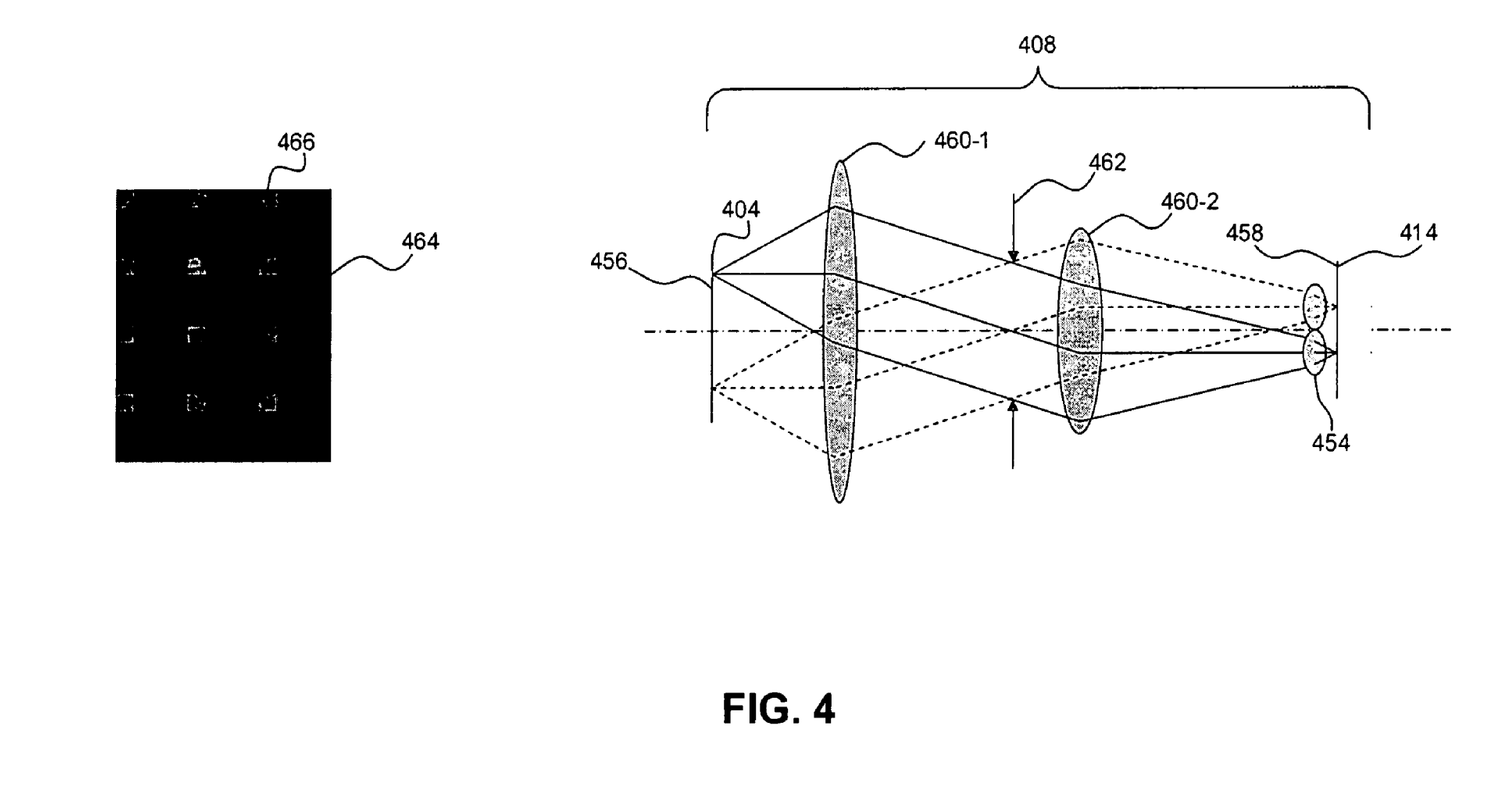

FIGS. 3 and 4 depict imaging system that can be used in the lithographic apparatus of FIGS. 1 and 2, according to various embodiments of the present invention.

FIG. 3 depicts an imaging system that can be used in the lithographic apparatus of FIGS. 1 and 2, according to one embodiment of the present invention. Projection system 308 includes a patterning device 304 positioned at an object plane 356 of projection system 308, an image plane 358 at which a substrate 314 is positioned, one or more lenses 360-1 to 360n (where n is an integer greater than or equal to 1), and an aperture 262. In this embodiment, object plane 356 is conjugate to image plane 358, and aperture 362 is positioned at a pupil (also referred to as the "pupil plane") of projection system 308. It is to be appreciated that projection system 308 can include other optical, electrical, and/or mechanical elements, as would be apparent to one of ordinary skill in the art. Patterned light leaving patterning device 304 is directed to a substrate 314 positioned at image plane 358 using lenses 360. Using this projection system 308, an image 364 formed on patterning device 304 is also an image seen at image plane 358, possibly with some magnification change, and thus the image exposed onto substrate 314. In one example, projection system 308 is used in a lithography tool that is used to form integrated circuits.

FIG. 4 depicts an imaging system including projection system 408, which is similar to projection system 308 in FIG. 3, except projection system 408 also includes a micro lens array (MLA) 454 positioned before a substrate 414 in an optical path between patterning device 404 and substrate 414. Using MLA 454 causes an image 364 (FIG. 3) formed on patterning device 404 to appear at an image plane 458 as image 464, which is the image exposed onto substrate 414. As seen, MLA 454 separates/splits an image 364 impinging thereon into segments 466 in image 464, and then MLA 454 de-magnifies each of the segments 466 before exposing them onto substrate 414. For example, in this embodiment a 4 row×3 column array of micro lenses is used for MLA 454 to form 12 segments 466.

An example use of a projection system similar to projection system 408 is found in U.S. application Ser. No. 10/939,947, filed Sep. 14, 2004, which is incorporate by reference herein in its entirety.

Exemplary Pixel Grid Imaging Scheme

Figure 5:
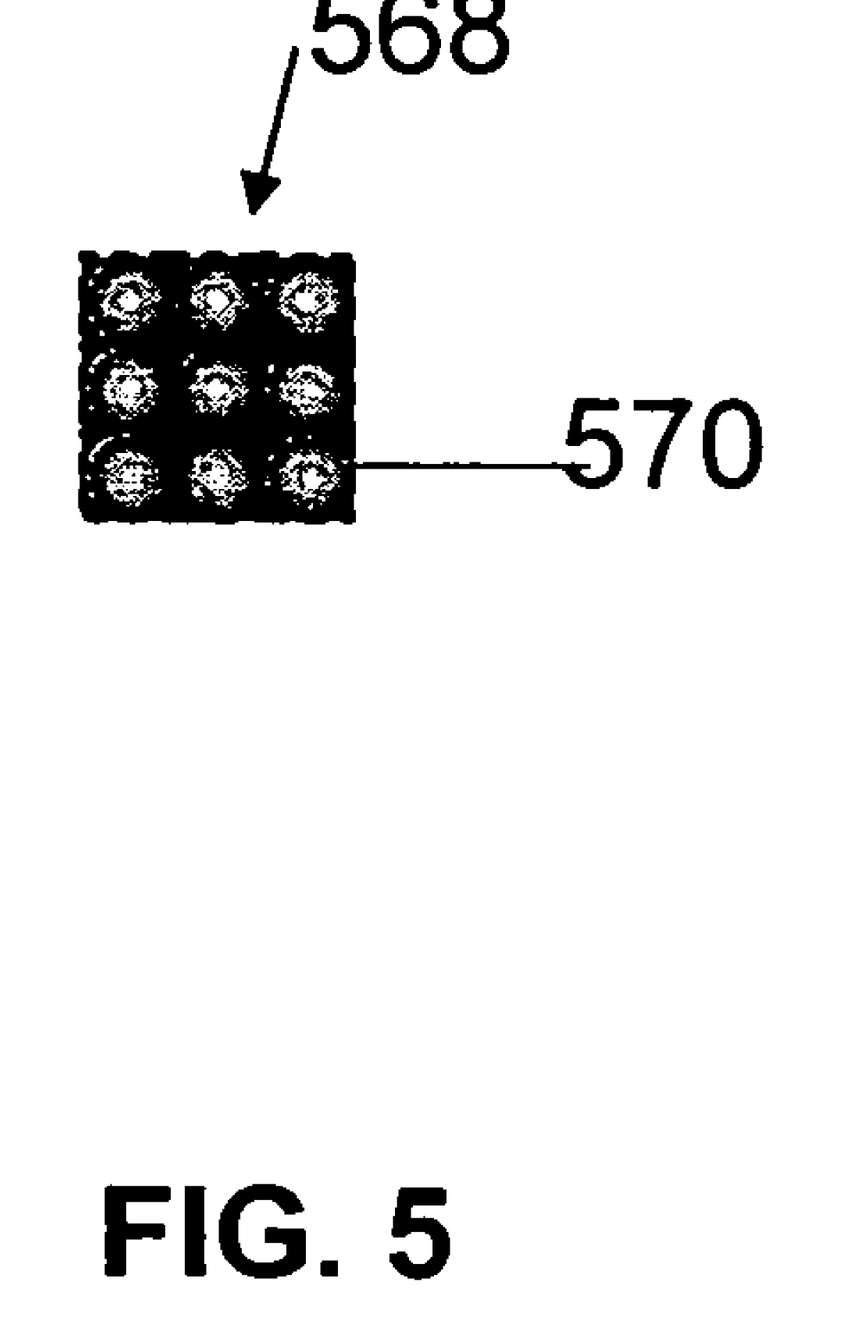
FIGS. 5, 6, and 7 depict images in a pixel grid imaging scheme at different positions within a lithography system, according to one embodiment of the present invention.
Figure 6:
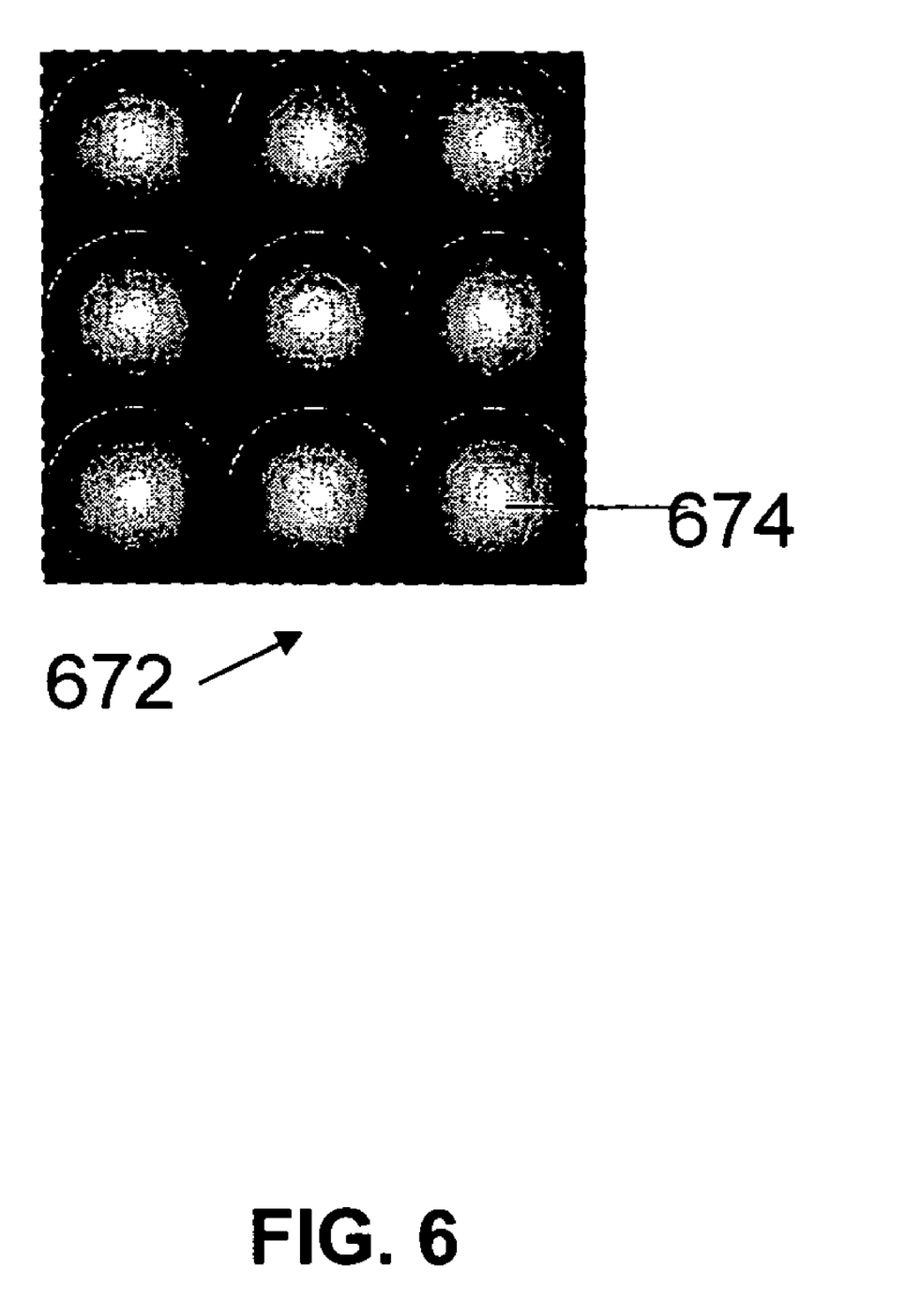
Figure 7:
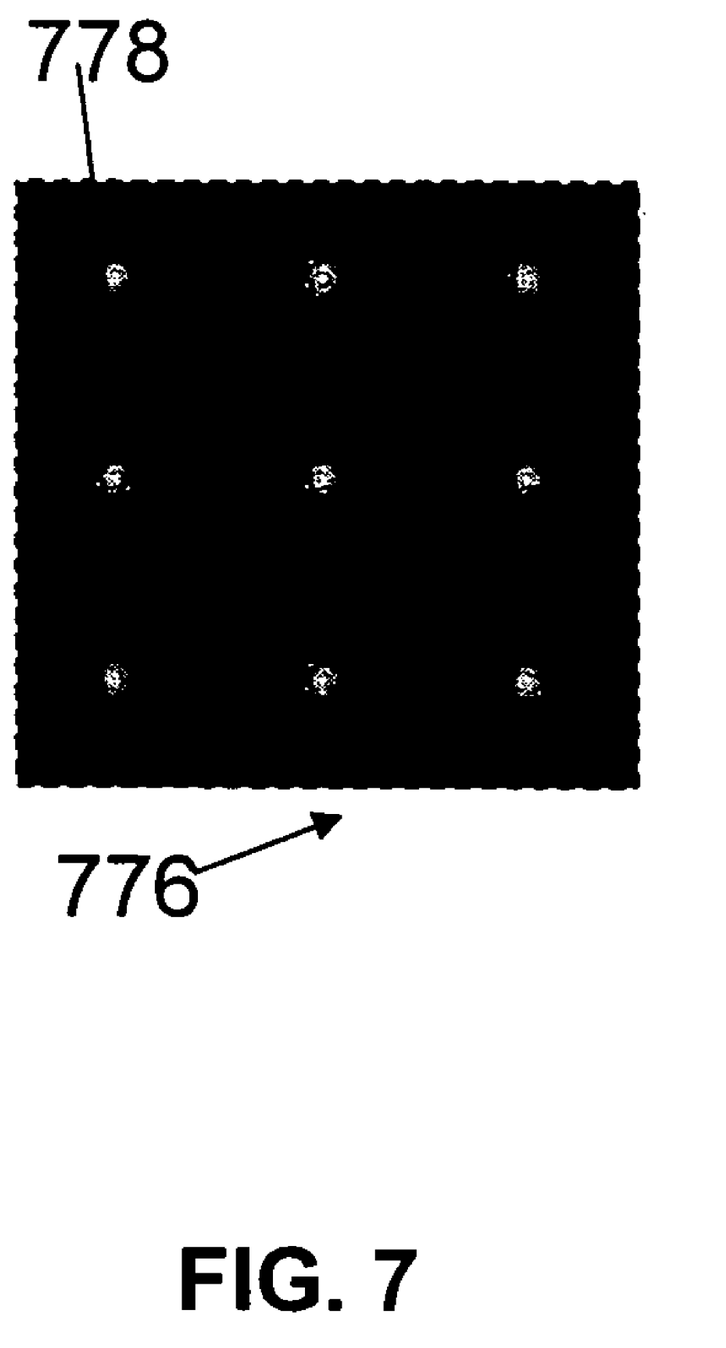

FIGS. 5, 6, and 7 depict images in a pixel grid imaging scheme at different positions within a lithography system, according to one embodiment of the present invention. FIG. 5 depicts an image 568, which includes spots/sections 570, formed on a patterning device. FIG. 6 depicts an image 672, which includes spots/sections 674 that are magnified views of sections 570. Image 672 can be either (a) an image of the patterning device as seen at a substrate when the patterned light is projected through a projection system that does not include an MLA or (b) an image that is received by the MLA in a projection system that includes the MLA. FIG. 7 depicts an image 776, which includes spots/section 778 that are Fourier transformed images of sections 674 in FIG. 6. Image 776 is seen just below the MLA.

Figure 8:
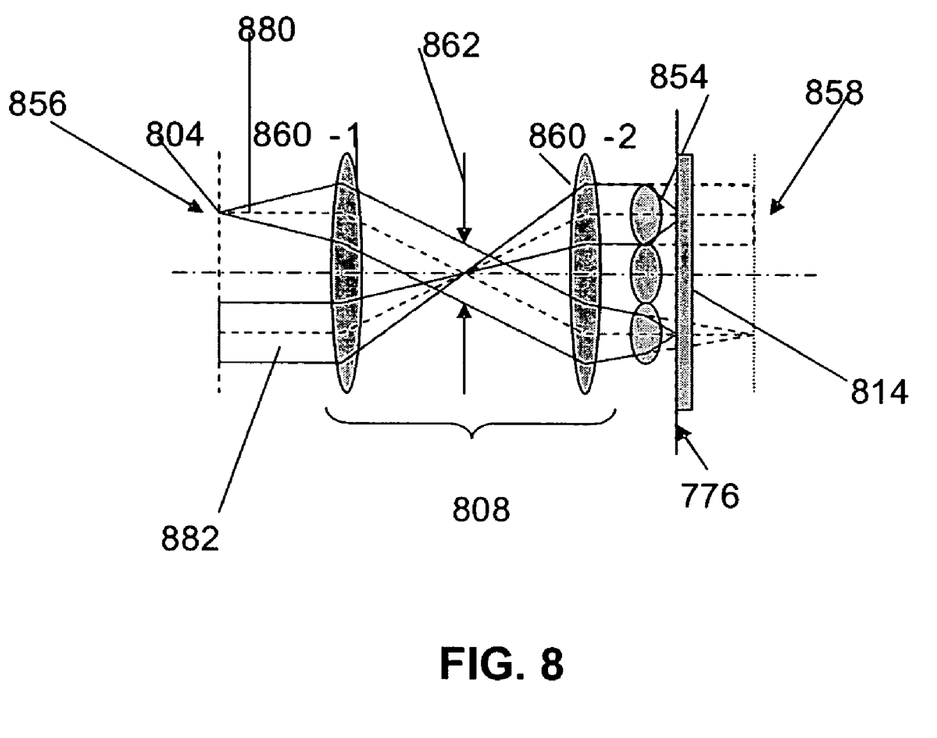
FIGS. 8 and 9 depict imaging systems that can be used in the lithographic apparatus of FIGS. 1 and 2, according to various embodiments of the present invention.
Figure 9:
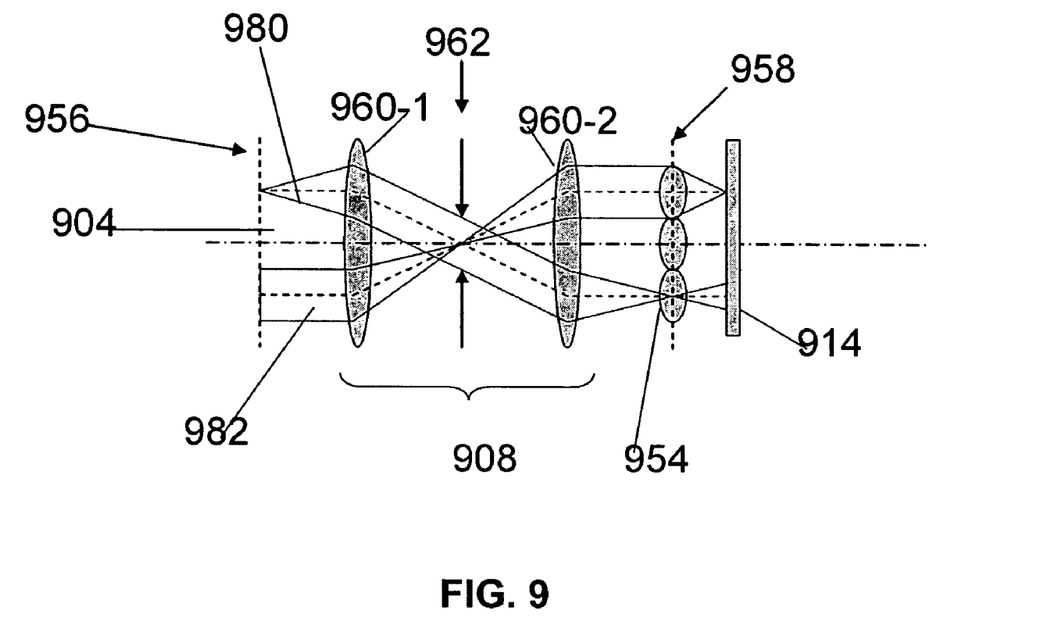

FIGS. 8 and 9 depict imaging systems that can be used in the lithographic apparatus of FIGS. 1 and 2, according to various embodiments of the present invention. Although these imaging systems are similar to the systems in FIGS. 3 a 4, the embodiments shown in FIGS. 8 and 9 using pixel grid imaging, and not the imaging scheme shown in FIGS. 3 and 4.

Turing first to FIG. 8, a light path 880 is formed when a light beam is focused or converged onto a pattering device 804, while light path 882 is formed when the light beam impinged on pattering device 804 with parallel or collimated rays. In path 880, the beam forms an image at a pupil plane of projection system 808, while in path 882 the beam forms an image at patterning device 804 and is a point at the pupil plane. In this configuration, image 776 is formed just below an MLA 854, at the substrate. Image 672 is a virtual image, which would be present at an image plane 858 in case MLA 854 were not present.

Turning now to FIG. 9 projection system 908 is similar to projection system 808, except a MLA 954 is positioned at an image plane 958 of projection system 908, while substrate 914 has been positioned away from image plane 958 of projection system 908. In this embodiment, MLA 954 is conjugate to a patterning device 904 positioned at an object plane 956 of projection system 908 and substrate 914 is conjugate to an aperture 962 positioned at a pupil/pupil plane of projection system 908. In this arrangement, an image based on an image 568 on patterning device 904 is located at an entrance pupil of MLA 954. Each spot 570 is directed into an entrance pupil of each element in MLA 350/750. In this configuration, an image 776 seen at substrate 914 includes Fourier transformed areas 778 of segments 570 of image 568 that are generated by MLA 954, which include small points or spots having only intensity information. These points 778 are of much smaller diameters than segments 570. For example, these points 778 can include only a zero-order diffraction order, e.g., a mean intensity. These small points 778 that include only intensity information are exposed onto substrate 914 instead of image 364 or segments 466 of an image 464 that were exposed on to substrates 314 and 414, respectively, as shown in FIGS. 3 and 4.

In the embodiments shown in FIG. 9, MLA 954 does not merely de-magnify an image impinging thereon, but Fourier transforms the image as well.

In one example, each segment 570 in image 568 falling onto MLA 804/904 is modulated through activation of a pixel or a group of pixels of patterning device 804/904 to change a gray tone of each segmented image 570. Then, through scanning of substrate 914, a desired image is realized on substrate 914.

In one example, to form features larger/longer than these small points 778, substrate 814/914 can be scanned during exposure.

In one example, imaging system 808/908 is used in a lithography tool that is used to produce flat panel displays.

Figure 10:
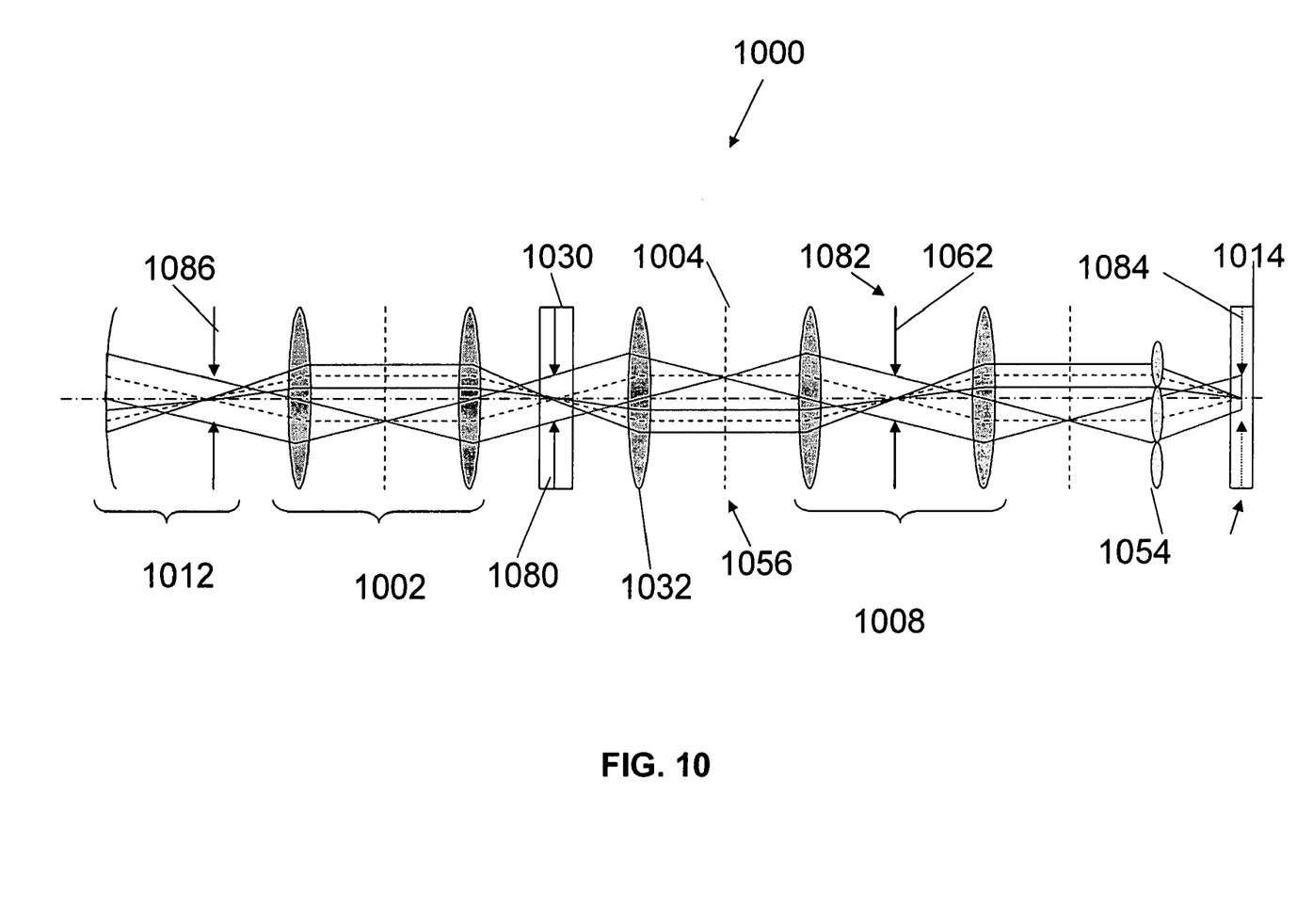
FIG. 10 depicts an exemplary lithography system, according to one embodiment of the present invention.
Figure 11:
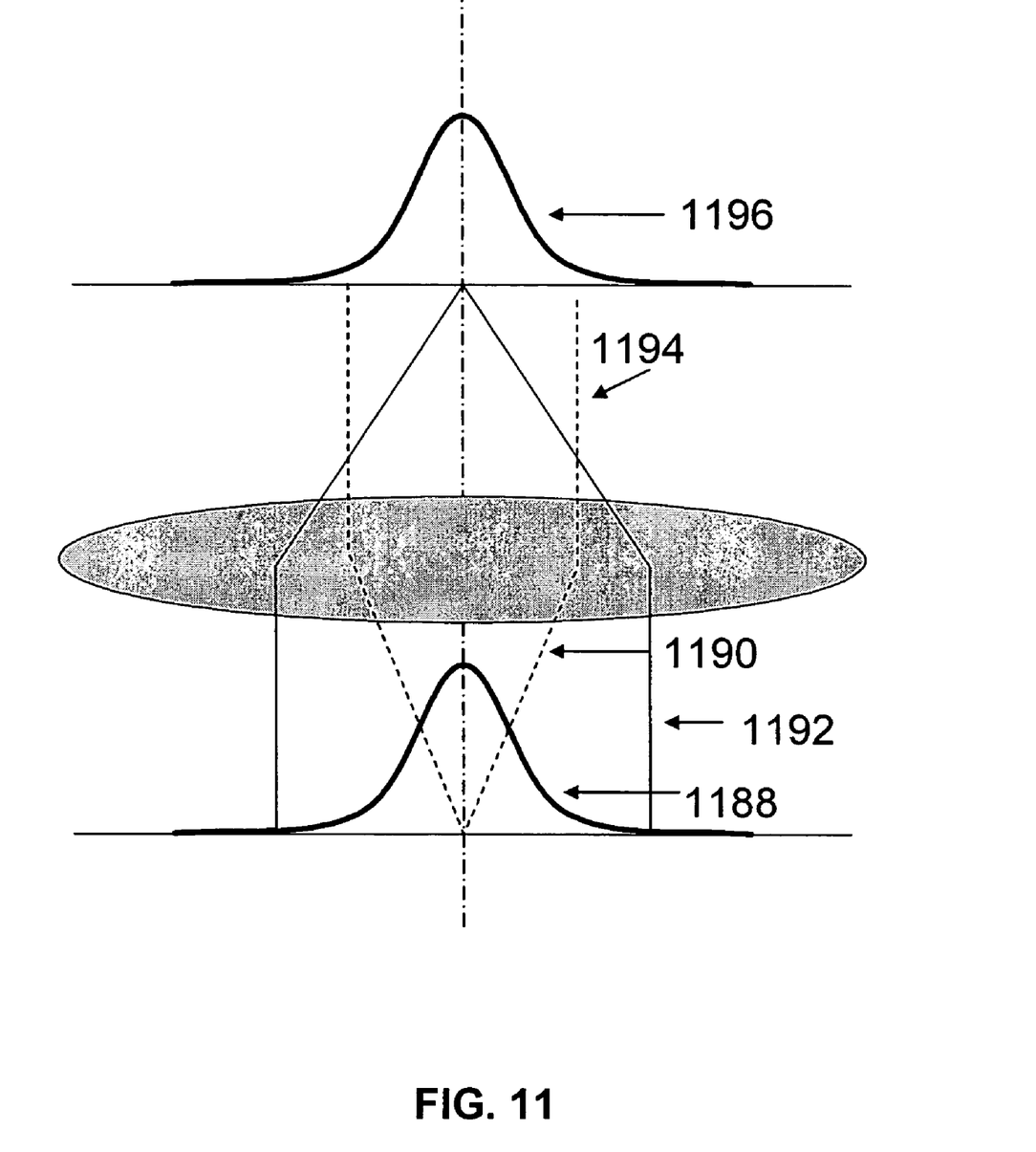
FIG. 11 shows a graph of intensity distribution at a pupil and at an image plane, according to one embodiment of the present invention.

FIG. 10 shows a lithography system 1000, according to one embodiment of the present invention. When a Gaussian beam, as shown in FIG. 11, is used to illuminate a patterning device patterning device 1004, multiple spots from sub-beams generated by a spot generator 1030 are present at patterning device 1004. At this location, the spot sizes are close to a minimum, with a waist location of the beam at patterning device 1004. In one example, when using a Gaussian beam shown in FIG. 11, it does not matter whether a pupil or field is imaged because both have substantially an equal lateral extend. In order to preserve the beam and desired waist locations, physical stops within conjugate planes of each of the stops are positioned throughout a lithography system. At these positions, an extent of the beam will be limited due to the stops. In one example, a first stop 1080 is located at a spot generator 1030, which can be similar to spot generator 230 in FIG. 2. A second stop 1082 is located at a pupil filter (aperture) 1062. Pupil filter 1062 can be used to filter out predetermined diffraction orders. This can be done in case the non-diffracted beam, and the diffracted beam, have a limited extent. A virtual third stop 1084 is located at a substrate 1014, which is not an actual stop, but due to the previous stops, light at substrate 1014 will have a limited extent. As just discussed, these stops are at conjugate planes with respect to each other and a stop 1086 within laser 1012.

In conventional projections systems, typically a MLA is not placed at a waist location of the impinging patterned beam. This can lead to a beam size being above a minimum size, thus neighboring spots can somewhat overlap causing mixing or cross-talk A wavefront may not be flat, but be curved, which can introduce spherical aberration. These problems are overcome using the arrangement in FIGS. 9 and 10.

In one example, through use of stops 1080, 1082, 1084, and 1086, a light beam will have a limited extent, which allows only wanted light (e.g., wanted diffraction orders) from existing at certain points in system 1000 to reduce overlap or cross-talk of the light.

In various examples, through these arrangements, the embodiments shown in FIGS. 8–10 can allow for less crosstalk, less sensitivity to color errors, and/or less sensitivity to far field phase instabilities.

In one example, a limited beam size is present in a laser cavity, at a spot generator, in a pupil of a projection system, and at a substrate. This allows a lithography system to include desired sized stops without effecting beam quality. For example, it can be desirable to have a limited beam size at the substrate. This allows for only a limited extent of the real spots to be taken into account when calculating pattern date in the data path, for example, using an inverse optics algorithm. In another example, having the limited beam size at aperture stop (pupil) allows for easier filtering out of diffraction orders generated by the patterning device.

Exemplary Beam Intensity Distribution

FIG. 11 shows a graph of intensity distributions and light rays, according to one embodiment of the present invention. In this embodiment, an image distribution 1188 (e.g., a Gaussian distribution) at a pupil and an intensity distribution 1196 (e.g., a Gaussian distribution) in a field are shown. Also, light rays 1190 from axial field points, light rays 1192 from non-axial pupil points, and light rays 1194 from non-axial field points are shown.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all, exemplary embodiments of the present invention as contemplated by the inventor(s), and thus, are not intended to limit the present invention and the appended claims in any way.

What is claimed is:

1. A lithographic apparatus, comprising:
    a radiation system that provides a beam of radiation;
    a patterning device that patterns the beam; and
    a projection system that projects the patterned beam onto a target portion of a substrate, the projection system comprising,
        a pupil stop positioned at a pupil plane of the projection system, and
        an array of lenses positioned at an image plane of the projection system,
    wherein the patterning device is conjugate to the array of lenses, and
    wherein the pupil stop is conjugate to the substrate, the substrate being spaced from the image plane.

2. The lithographic apparatus of claim 1, wherein:
    each lens in the array of lenses receives a segment of an image of the patterning device; and
    a Fourier transform of each of the segments of the image of the patterning device is formed on the substrate.

3. The lithographic apparatus of claim 2, further comprising:
    an actuator that moves the substrate while the projection system projects the patterned beam onto the target portion of the substrate.

4. The lithographic apparatus of claim 1, wherein:
    the patterning device comprises an array of individually controllable elements.

5. The lithographic apparatus of claim 4, further comprising:
    a refraction grating that divides the beam of radiation into a plurality of sub-beams, wherein each sub-beam is directed onto one or more elements in the array of individually controllable elements.

6. The lithographic apparatus of claim 1, wherein the substrate is a semiconductor wafer.

7. The lithographic apparatus of claim 1, wherein the substrate is a flat panel display glass substrate.

8. The lithographic apparatus of claim 1, further comprising:
a spot generator that divides the beam of radiation into a plurality of sub-beams that are directed onto the patterning device.

9. The lithographic apparatus of claim 8, further comprising:
a first stop positioned within the radiation system;
a second stop positioned adjacent the spot generator and positioned conjugate to the first stop; and
a third stop positioned adjacent the pupil and positioned conjugate to the second stop.

10. The lithographic apparatus of claim 9, further comprising:
a filter positioned within the pupil plane.

11. A flat panel display formed using the lithographic apparatus of claim 1.

12. A device manufacturing method, comprising:
patterning a beam of radiation using a patterning device;
directing the patterned beam onto a microlens array in a projection system, the microlens array being positioned conjugate to the patterning device;
forming a plurality of segments of the pattern beam, each segment being formed using a respective lens in the microlens array; and
projecting a Fourier transform of each of the segments of the patterned beam onto a target portion of a substrate.

13. A flat panel display formed using the method of claim 12.

14. A method, comprising:
positioning a patterning device at an object plane of a projection system;
positioning a microlens array at an image plane of the projection system, which is conjugate to the patterning device at the object plane; and
positioning a workpiece conjugate to a pupil plane of the projection system,
wherein a beam of radiation is patterned using the patterning device, and
wherein the patterned beam is projected onto a target portion of the workpiece using the projection system.

15. The method of claim 14, further comprising:
positioning a spot generator before the patterning device that generates a plurality of spots which impinge on the patterning device.

16. The method of claim 15, further comprising:
positioning a first stop within a radiation source that generates the beam of radiation;
positioning a second stop adjacent the spot generator and conjugate to the first stop;
positioning a third stop at the pupil plane and conjugate to the second stop; and
positioning a fourth stop adjacent the substrate and conjugate to the third stop.

17. The method of claim 16, further comprising:
positioning a filter within the pupil plane.

18. A flat panel display formed using the method of claim 14.

* * * * *